May 9, 1967 B. E. GUISINGER 3,319,176

HIGH LINEARITY LIMITER CIRCUIT USING NON-SELECTED COMPONENTS

Filed July 17, 1964 2 Sheets-Sheet 1

BARRETT E. GUISINGER
INVENTOR.

BY James H. Griffin
ATTORNEY

May 9, 1967 B. E. GUISINGER 3,319,176

HIGH LINEARITY LIMITER CIRCUIT USING NON-SELECTED COMPONENTS

Filed July 17, 1964 2 Sheets-Sheet 2

BARRETT E. GUISINGER
INVENTOR.

BY James H. Griffin
ATTORNEY

United States Patent Office 3,319,176

Patented May 9, 1967

3,319,176
HIGH LINEARITY LIMITER CIRCUIT USING NON-SELECTED COMPONENTS

Barrett E. Guisinger, Santa Clara, Calif., assignor to Ampex Corporation, Redwood, Calif., a corporation of California Filed July 17, 1964, Ser. No. 383,352
9 Claims. (Cl. 330—28)

Figure 1:
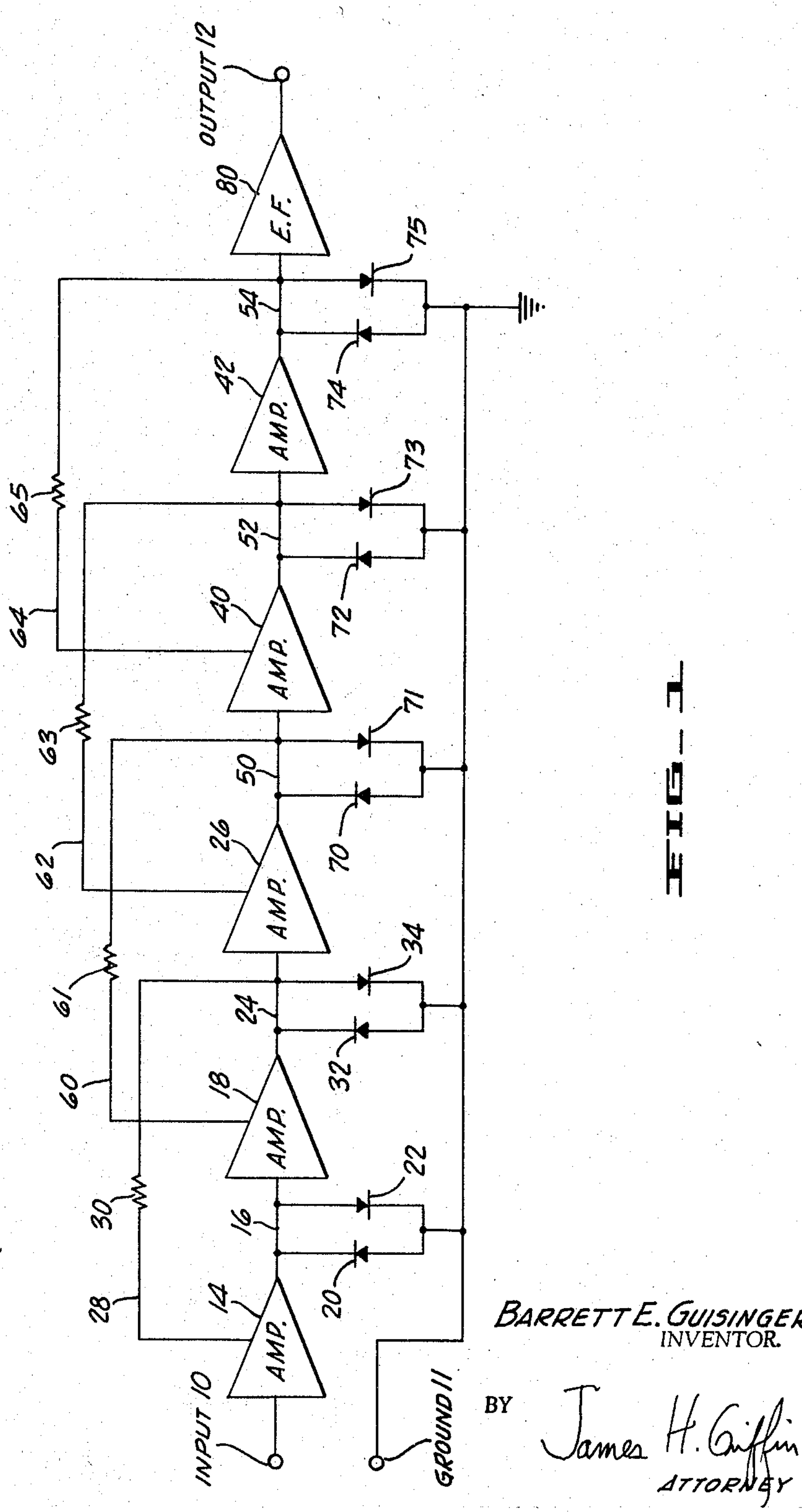

This invention relates to limiter circuit for use in the FM demodulators of magnetic tape recorders and the like.

The invention will be described in connection with a magnetic tape recorder FM demodulator, but it is to be understood that it may be applied anywhere where limiting or clipping is to be done. Essentially, the limiter is an amplifier or series of amplifiers operated between saturation and cutoff in a biasing network such that the saturation voltage and the cut-off voltage are very close to one another. Thus the amplitude elements (and, in particular, excessive amplitude variations that might react adversely upon the following circuitry in the demodulator) are eliminated by a limiter; so that only the FM portion of the input signal passes through. To ensure good AM rejection, a number of limiters are used in cascade in most applications, with about five limiter stages, practically all amplitude modulation and noise is eliminated, and between 40 and 50 db of limiting is provided.

In the design of a limiter several factors must be considered: second harmonic distortion, delay variation with input amplitude, and bandwidth. The second harmonic distortion of the RF signal in a limiter is probably the most important consideration. The reason that the design of a limiter centers around second harmonic distortion delay variation with input amplitude and bandwidth is the fact that all three of these distortion components affect the information transmitted in an FM signal. All of the information in an FM signal is transmitted in the zero crossings of the carrier frequency. The second harmonic distortion shifts these zero crossings from their original position as does delay variation with input amplitudes. The purpose of the limiter is to remove amplitude variations from the FM carrier frequency signal. If the limiter propagation delay of the signal is a function of the input signal amplitude, then the length of time it takes any one zero crossing to propagate through the limiter circuit will vary with input carrier amplitude. This produces the same effect on the detector circuit following the limiter that frequency modulation does. Thus, great care must be taken in the design of the limiter so that the circuitry does not introduce any shift in the zero crossings of the input carrier frequency. In the past, the use of emitter followers after each amplifier (thereby doubling the number of active elements in the circuit), the use of the so-called balanced limiter, or the very careful matching of diodes at the input to each amplifier have been the usual expedients for keeping distortion down.

One aspect of the distortion problem is the fact that amplitudes of the higher frequencies are limited less strongly relative to amplitudes of the lower frequencies. If, for instance, we consider the bandwidth being 1 mc. to 20 mc., in general it is more difficult to achieve the 20 mc. response than it is the 1 mc. That is to say, the frequency response is rolling off at 20 mc. Therefore, the lower frequencies are limited more strongly relative to the amplitudes of the higher frequencies. Frequency response of most limiters is far from being ideally linear, but should be flat over the bandwidth of interest.

It is therefore, a general object of this invention to provide an improved limiter circuit.

Another object of this invention is to provide a limiter wherein the design consideration of second harmonic distortion, time delay, and frequency response are all maximized without undue sacrifice of any one.

Another object of this invention is to provide a wide bandwidth, low distortion limiter circuit which does not require the numerous components of the balanced or emitter follower limiters or the careful matching of components heretofore necessary.

A primary purpose in designing applicant's limiter was to produce a limiter that required a minimum number of components and yet still maintain good linearity without using selected components. If the limiter circuit described below is built wthout using selected components, the performance that results will be comparable to the limiter circuits now used in FM tape recording. This is an advantage in itself, as in the present limiters the components used must be carefully selected. Obviously, if selected components are used in applicant's new limiter, a higher degree of performance will result.

In the achievement of the above and other objects and as a feature of applicant's invention there is provided a limiter circuit wherein the same non-symmetries that increase distortion and lower frequency response are fed back to cancel themselves. As another feature of applicant's invention the limiter diodes are included in the feedback loop. As a further feature of applicant's invention the feedback loop encompasses two stages of amplification, the degenerative feedback loop running from the output of one amplifier back to the input of the amplifier preceding it.

In general, classical circuit theory holds that it is impossible to apply feedback around non-linear circuits. This is the reason feedback limiters had not been developed previously. Such reasoning failed because the theorists assumed that feedback around a non-linear circuit had to be linear, which is not the case in the limiter hereinafter described. By adding non-linear feedback loops, the feedback correction is restricted only to the period of time when both diodes are cut off, thereby linearizing the leading and trailing edges of the limited square wave.

Figure 2:
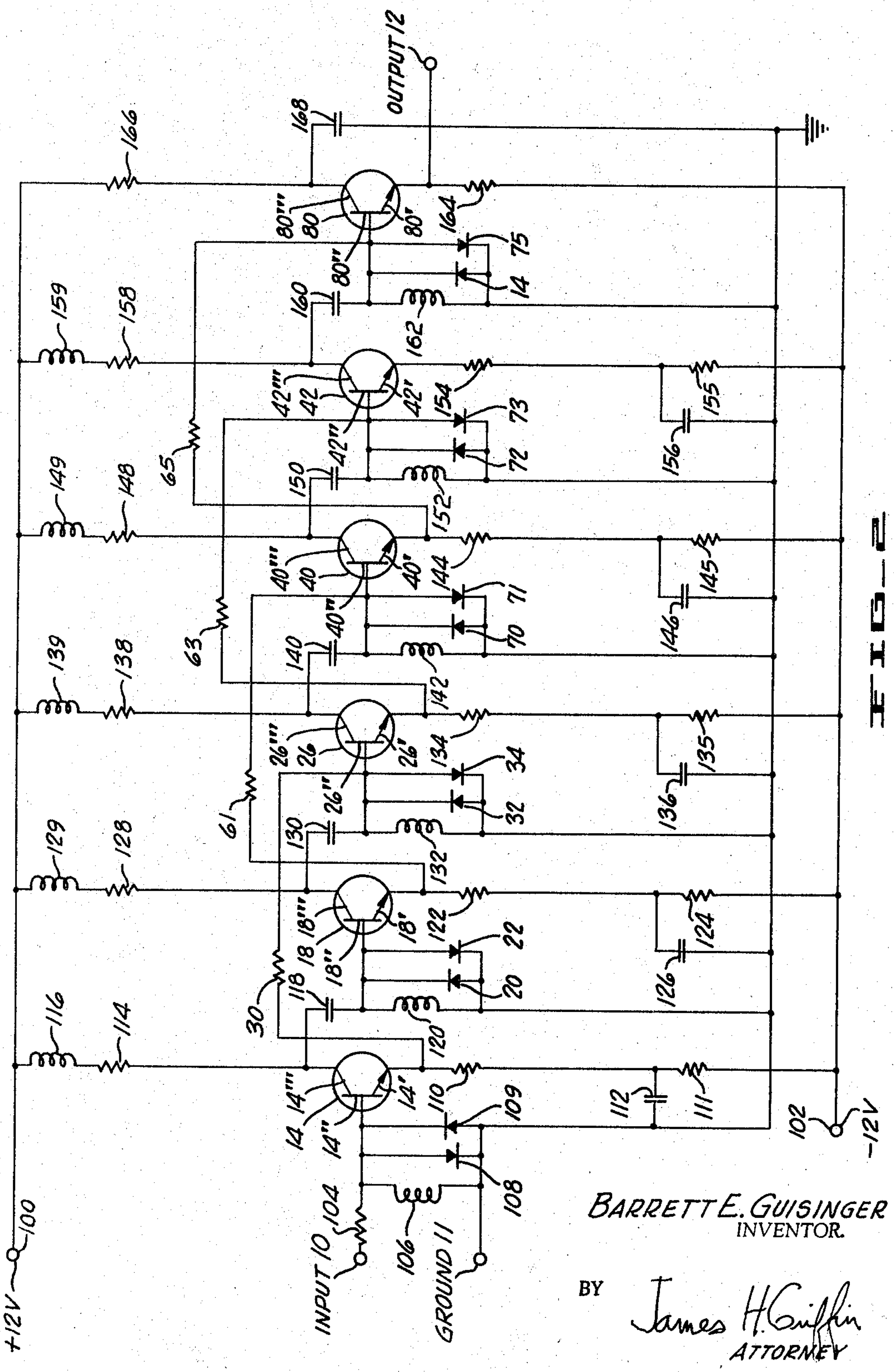

Other objects and features of this invention and a fuller understanding thereof may be had by referring to the following description and claims taken in conjunction with the acompanying drawings, in which:

FIGURE 1 is a block diagram of a limiter wherein the various features of applicant's invention are applied; and FIGURE 2 is a schematic of a circuit constructed according to the block diagram of FIGURE 1.

Referring to FIGURE 1, a preferred embodiment of applicant's invention, as shown there in block form, has an input terminal 10, a ground terminal 11, an output terminal 12, a first amplifier 14, and a first coupling 16 between the first amplifier and a second amplifier 18. Two diodes 20 and 22 of opposite conductivity are coupled in parallel between the first coupling 16 and ground 11. A second coupling 24 runs from the output terminal of the amplifier 18 to a third amplifier 26. A first degenerative feedback loop 28 having a resistor 30 runs from the second coupling 24 to the first amplifier 14. Two diodes 32 and 34 of opposite conductivity are coupled in parallel between the second coupling 24 and ground 11. Two additional amplifier stages 40 and 42 follow all of those already described in a similar manner, utilizing couplings 50, 52, and 54, additional degenerative feedback loops 60, 62, and 64, and paired parallel limiter diodes 70 and 71, 72 and 73, and 74 and 75 between the respective coupling and ground 11. The output signal of the limiter is coupled through an emitter follower stage 80 to the output terminal 12.

Referring to the schematic of FIGURE 2, which is constructed according to the system block diagram of FIGURE 1, it will be seen that a limiter circuit following the principles of applicant's invention has a positive power supply 100 and a negative power supply 102, for purposes of illustration herein specified as +12 volts and −12 volts, respectively. The first amplifier 14 is shown as a transistor having emitter 14', base 14'', and collector 14'''. The base 14'' is coupled to the input terminal 10 through a resistor 104 and is coupled to ground through a D.C. grounding inductor 106 and also through two parallel limiter diodes 108 and 109 of opposite conductivity. The emitter 14' of the first amplifier 14 is coupled to the negative power supply 102 through two resistors 110 and 111. A decoupling capacitor 112 is connected from a point between the two resistors 110 and 111 to ground 11. The collector 14''' is coupled to the positive power supply 100 through the series combination of a resistor 114 and a peaking inductor 116.

The second amplifier 18 is shown as a transistor having an emitter 18', base 18'', and collector 18'''. The base 18'' is coupled to the collector 14''' of the first amplifier 14 through a capacitor 118 and is coupled to ground 11 through a D.C. grounding inductor 120 in parallel with the diodes 20 and 22. The emitter 18' of the second amplifier 18 is coupled to the negative power supply 102 through two resistors 122 and 124. The decoupling capacitor 126 is connected from a point between the two resistors 122 and 124 to ground 11. The collector 18''' of the second amplifier 18 is coupled to the positive power supply 100 through the series combination of a resistor 128 and a peaking inductor 129.

The third amplifier 26 is shown as a transistor having emitter 26', base 26'', and collector 26'''. The base 26'' is coupled to the collector 18''' of the second amplifier 18 through a capacitor 130 and is coupled to ground 11 through a D.C. grounding inductor 132 in parallel with the diodes 32 and 34. In the practice of applicant's feedback limiter invention the base 26'' of the third amplifier 26 is also coupled through the resistor 30 to the emitter 14' of the first amplifier 14. The emitter 26' of the third amplifier 26 is coupled to ground through two resistors 134 and 135. A decoupling capacitor 136 is connected from a point between the two resistors 134 and 135 to ground 11. The collector 26''' is coupled to the positive power supply 100 through the series combination of a resistor 138 and a peaking inductor 139.

The fourth amplifier 40 is shown as a transistor having emitter 40', base 40'', and collector 40'''. The base 40'' is coupled through a capacitor 140 to the collector 26''' of the third amplifier 26 and is also coupled to ground through a D.C. grounding inductor 142 in parallel with the two limiter diodes 70 and 71. According to the principles of the instant invention, signals arriving at the base 40'' are fed back to the emitter 18' through the resistor 61. The emitter 40' of the fourth amplifier 40 is coupled to the negative power supply 102 through two resistors 144 and 145. A decoupling capacitor 146 is connected from a point between the two resistors 144 and 145 to ground 11. The collector 40''' is coupled to the positive power supply 100 through the series combination of a resistor 148 and a peaking inductor 149.

The fifth amplifier stage 42 is shown as a transistor having emitter 42', base 42'', and collector 42'''. The base 42'' is coupled through a capacitor 150 to the collector 40''' of the fourth amplifier 40 and is also coupled to ground through a D.C. grounding inductor 152 in parallel with the two limiter diodes 72 and 73. In the practice of applicant's feedback limiter invention the base 42'' of the fifth amplifier 42 is also coupled through the resistor 63 to the emitter 26' of the third amplifier 26. The emitter 42' of the fifth amplifier 42 is coupled to the negative power supply 102 through two resistors 154 and 155. A decoupling capacitor 156 is connected from a point between the two resistors 154 and 155 and ground 11. The collector 42''' is coupled to the positive power supply 100 through the series combination of a resistor 158 and a peaking inductor 159.

The emitter follower 80 is shown as a transistor having emitter 80', base 80'', and collector 80'''. The base 80'' is coupled to the collector 42''' of the fifth amplifier stage 42 through a capacitor 160 and is also coupled to ground through a D.C. grounding inductor 162 in parallel with the diodes 74 and 75. To achieve further degenerative feedback, the base 80'' is also coupled through the resistor 65 to the emitter 40' of the fourth amplification stage 40. The emitter 80' of the emitter follower 80 is coupled to the negative power supply 102 through a resistor 164. The collector 80''' of the emitter follower 80 is coupled to the positive power supply 100 through a resistor 166 and is also decoupled to ground 11 through a capacitor 168. The emitter 80' of the emitter follower 80 is directly coupled to the output terminal 12 of applicant's limiter circuit.

In the operation of the limiter described above and shown in FIGURES 1 and 2, the input at the terminal 10 is an FM signal which will be demodulated by circuitry following the limiter and coupled to the output terminal 12. At each successive amplification stage in the circuit of FIGURE 2, the input electrode (i.e., the transistor base) is kept free of D.C. voltage other than ground by an inductor (106, 120, 132, 142, 152, and 162). The parallel diodes of opposite conductivity coupled between each input electrode and ground 11 repeatedly slice off excess positive and negative amplitudes of the FM pulses, so that after five stages amplification and reslicing no spurious amplitude variations of the input FM waveform appear to upset the functioning of the circuitry beyond the output terminal 12. The collector inductances of each amplifier (116, 129, 139, 149, and 159) linearize the frequency response of the limiter at high frequencies by their own varying frequency-impedance response characteristics.

The performance of each degenerative feedback loop (28, 60, 62, and 64) will be illustrated by a detailed explanation of the first feedback loop 28, shown in FIGURE 2 as the coupling through the resistor 30 of the output from the second amplifier 18 back to the emitter 14' of the first amplifier 14. When either diode 32 or 34 at the origin of the feedback loop 28 is conducting, the loop is essentially grounded at that end, and feedback is minimized. Only during the transition time when neither of the diodes are conducting does the feedback provided by the loop 28 increase. Thus the feedback is nonlinear and produces the greatest correction during the transition time between conduction of the diodes 32 and 34, which, of course, corresponds to the arrival time of the input FM sine wave zero crossings. As a result, the effect of each of the feedback loops 28, 60, 62, and 64 is to provide great correction and linearization of the square wave rise and fall times (and thus lower distortion in the FM signal) while having minimum effect whenever one of the limiter diodes is conducting, thereby allowing full limiting to take place. The overall accomplishment of applicant's invention, therefore, is to feed back the nonlinearities of the limiter to cancel themselves in an earlier stage, while at the same time not otherwise interfering with the performance of the basic limiting elements.

A feedback limiter circuit in accordance with the above description and drawing was built and operated using the following components:

*Voltages*

100—+12 v. D.C.
102—−12 v. D.C.

*Transistors*

| | |
|---|---|
| **14**—2N706A | **40**—2N706A |
| **18**—2N706A | **42**—2N706A |
| **26**—2N706A | **80**—2N706A |

*Diodes*

| | |
|---|---|
| 20—HD7842 | 71—HD7842 |
| 22—HD7842 | 72—HD7842 |
| 32—HD7842 | 73—HD7842 |
| 34—HD7842 | 108—HD7842 |
| 70—HD7842 | 109—HD7842 |

*Resistors (ohms)*

| | |
|---|---|
| 30—470 | 134—39 |
| 61—470 | 135—910 |
| 63—470 | 138—620 |
| 65—470 | 144—39 |
| 104—200 | 145—910 |
| 110—39 | 148—620 |
| 111—910 | 154—39 |
| 114—620 | 155—910 |
| 122—39 | 158—620 |
| 124—910 | 164—620 |
| 128—620 | 166—300 |

*Capacitors (microfarads)*

| | |
|---|---|
| 112—0.1 | 146—0.1 |
| 118—0.1 | 150—0.1 |
| 126—0.1 | 156—0.1 |
| 130—0.1 | 160—0.1 |
| 136—0.1 | 168—0.1 |
| 140—0.1 | |

*Inductors (microhenries)*

| | |
|---|---|
| 106—330 | 142—330 |
| 116—10 | 149—10 |
| 120—330 | 152—330 |
| 129—10 | 159—10 |
| 132—330 | 162—330 |
| 139—10 | |

The above specified feedback limiter removed some previous limitations on the performance of the wideband FM tape recorders wherein it was used by achieving a high degree of phase linearity as a function of amplitude stability of the RF signal being played back by the recorder.

Thus, applicant has achieved an improved limiter circuit wherein the design considerations of second harmonic distortion, time delay, and frequency response are all maximized without undue sacrifice of any one of these factors. It will be noted that a minimum number of components is required by the circuit shown in FIGURE 2 and that careful matching or high quality of components is not necessary to the operation of that circuit. Without selecting components, the degree of performance is comparable to well-designed limiters with matched components. If the components are matched in this limiter a further improvement is gained, in the order of six to ten db better than present day limiters. Thus, the function of applicant's limiter is two-fold: to provide a limiter that is low cost and easy to produce for applications in tape recording or limiting that do not require a better limiter than now exists and also to provide a limiter circuit that provides improved performance over present day limiters in areas that this improved performance is required, if components are matched.

A number of alternative arrangements will readily suggest themselves to those skilled in the art. For example, N-P-N conductivity type transistors and P-N-P conductivity type transistors may be interchanged, if only the power supply, biasing elements, and other circuit components are appropriately reversed. However, although the invention has been described with a certain degree of particularity, it is to be understood that the present disclosure has been made only by way of example and that numerous changes in the details of construction and the combination and arrangement of parts may be resorted to without departing from the spirit and the scope of the invention as hereinafter claimed.

What is claimed is:

1. A limiter circuit comprising: plural amplifier stages, each amplifier stage having input and output electrodes, means including parallel unidirectional conductive devices of opposite polarities coupled between the output electrode of each stage and a source of reference potential for limiting the amplitudes of the output signals of said amplifier stages, and a degenerative feedback loop coupled from the output electrode of a first one of the amplifier stages to an input electrode of a preceding one of the amplifier stages.

2. A limiter circuit having an input terminal, a ground terminal, an output terminal, amplifier stages coupled in series between the input terminal and the output terminal, each amplifier stage including an active element having input and output electrodes, parallel diodes of opposite conductivity coupled between the output electrode of each active element and ground, and a degenerative feedback line coupled from the output electrode of one of said active elements to the input electrode of some preceding active element.

3. A limiter circuit having an input terminal, a ground terminal, an output terminal, a first transistor having emitter, base, and collector, the base of the first transistor being coupled to the input terminal and through the parallel combination of a first diode and a second diode of conductivity opposite to that of the first diode to ground, a second transistor having emitter, base, and collector, the base of the second transistor being coupled to the collector of the first transistor and being coupled through the parallel combination of a third diode and a fourth diode of conductivity opposite to that of the third diode to ground, a third transistor having emitter, base, and collector, the base of the third transistor being coupled to the collector of the second transistor, through the parallel combination of a fifth diode and a sixth diode of conductivity opposite that of the fifth diode to ground, and through a first feedback resistor to the emitter of the first transistor, a fourth transistor having emitter, base, and collector, the base of the fourth transistor being coupled to the collector of the third transistor, through the parallel combination of a seventh diode and an eighth diode of conductivity opposite that of the seventh diode to ground, and through a second feedback resistor to the emitter of the second transistor, a fifth transistor having emitter, base, and collector, the base of the fifth transistor being coupled to the collector of the fourth transistor, through the parallel combination of a ninth diode and a tenth diode of conductivity opposite to that of the ninth diode to ground, and through a third feedback resistor to the emitter of the third transistor, the collector of the fifth transistor being coupled to the output terminal and through a fourth feedback resistor to the emitter of the fourth transistor.

4. A limiter circuit having an input terminal, a ground terminal, an output terminal, a first transistor having emitter, base, and collector, the base of the first transistor being coupled to the input terminal and through the parallel combination of a first diode and a second diode of conductivity opposite to that of the first diode to ground, a second transistor having emitter, base, and collector, the base of the second transistor being coupled to the collector of the first transistor and being coupled through the parallel combination of a third diode and a fourth diode of conductivity opposite to that of the third diode to ground, a third transistor having emitter, base, and collector, the base of the third transistor being coupled to the collector of the second transistor, through the parallel combination of a fifth diode and a sixth diode of conductivity opposite that of the fifth diode to ground, and through a first feedback resistor to the emitter of the first transistor, a fourth transistor having emitter, base, and collector, the base of the fourth transistor being coupled to the collector of the third transistor, through the parallel combination of a seventh diode and an eighth diode of conductivity opposite that of the seventh diode to ground, and through a second feedback resistor to the emitter of the second transistor, a fifth transistor having emitter, base, and collector, the base of the fifth transistor being coupled to the collector of the fourth transistor, through the parallel combination of a ninth diode and a tenth diode of conductivity opposite to that of the ninth diode to ground, and through a third feedback resistor to the emitter of the third transistor, a sixth transistor having emitter, base, and collector, the base of the sixth transistor being coupled to the collector of the fifth transistor, through the parallel combination of an eleventh diode and a twelfth diode of conductivity opposite to that of the eleventh diode to ground, and through a fourth feedback resistor to the emitter of the fourth transistor, and the emitter of the sixth transistor being directly coupled to the output terminal.

5. A limiter circuit having an input terminal, a ground terminal, an output terminal, a first resistor coupled to the input terminal, a first inductor coupled between the first resistor and ground, the parallel combination of first and second diodes of opposite conductivity coupled in parallel with the first inductor between the first resistor and ground, a first transistor having emitter, base, and collector, the base of the first transistor being coupled to the junction between the first resistor and the parallel first inductor and diodes, a second transistor having emitter, base, and collector, the base of the second transistor being coupled through a first capacitor to the collector of the first transistor and being coupled through the parallel combination of a second inductor, a third diode, and a fourth diode of conductivity opposite to that of the third diode to ground, a third transistor having emitter, base, and collector, the base of the third transistor being coupled through a second capacitor to the collector of the second transistor, through the parallel combination of a third inductor, a fifth diode and a sixth diode of conductivity opposite that of the fifth diode to ground, and through a first feedback resistor to the emitter of the first transistor, a fourth transistor having emitter, base, and collector, the base of the fourth transistor being coupled through a third capacitor to the collector of the third transistor, through the parallel combination of a fourth inductor, a seventh diode, and an eighth diode of conductivity opposite that of the seventh diode to ground, and through a second feedback resistor to the emitter of the second transistor, a fifth transistor having emitter, base, and collector, the base of the fifth transistor being coupled through a fourth capacitor to the collector of the fourth transistor, through the parallel combination of a fifth inductor, a ninth diode, and a tenth diode of conductivity opposite to that of the ninth diode to ground, and through a third feedback resistor to the emitter of the third transistor, a sixth transistor having emitter, base, and collector, the base of the sixth transistor being coupled through a fifth capacitor to the collector of the fifth transistor, through the parallel combination of a sixth inductor, an eleventh diode, and a twelfth diode of conductivity opposite to that of the eleventh diode to ground and through a fourth feedback resistor to the emitter of the fourth transistor, and the emitter of the sixth transistor being directly coupled to the output terminal.

6. A limiter circuit having an input terminal, a ground terminal, an output terminal, a first resistor coupled to the input terminal, a first inductor coupled between the first resistor and ground, the parallel combination of first and second diodes of opposite conductivity coupled in parallel with the first inductor between the first resistor and ground, a first transistor having emitter, base, and collector, the base of the first transistor being coupled to the junction between the first resistor and the parallel first inductor and diodes, the collector of the first transistor being coupled to the series combination of a second resistor and a second inductor, a second transistor having emitter, base, and collector, the base of the second transistor being coupled through a first capacitor to the collector of the first transistor and being coupled through the parallel combination of a third inductor, a third diode, and a fourth diode of conductivity opposite to that of the third diode to ground, and the collector of the second transistor being coupled to the series combination of a third resistor and a fourth inductor, a third transistor having emitter, base, and collector, the base of the third transistor being coupled to the series combination of a fourth collector of the second transistor, through the parallel combination of a fifth inductor, a fifth diode and a sixth diode of conductivity opposite that of the fifth diode to ground, and through a first feedback resistor to the emitter emitter, base, and collector, the base of the fourth transistor being coupled to the series combination of a fourth resistor and a sixth inductor, a fourth transistor having emitter, base, and collector, the base of the four transistor being coupled through a third capacitor to the collector of the third transistor, through the parallel combination of a seventh inductor, a seventh diode, and an eighth diode of conductivity opposite that of the seventh diode to ground, and through a second feedback resistor to the emitter of the second transistor, and the collector of the fourth transistor being coupled to the series combination of a fifth resistor and an eighth inductor, a fifth transistor having emitter, base, and collector, the base of the fifth transistor being coupled through a fourth capacitor to the collector of the fourth transistor, through the parallel combination of a ninth conductor, a ninth diode, and a tenth diode of conductivity opposite to that of the ninth diode to ground, and through a third feedback resistor to the emitter of the third transistor and the collector of the fifth transistor being coupled to the series combination of a sixth resistor and a tenth inductor, a sixth transistor having emitter, base, and collector, the base of the sixth transistor being coupled through a fifth capacitor to the collector of the fifth transistor, through the parallel combination of an eleventh inductor, an eleventh diode, and a twelfth diode of conductivity opposite to that of the eleventh diode to ground and through a fourth feedback resistor to the emitter of the fourth transistor, and the emitter of the sixth transisor being directly coupled to the output terminal 12.

7. A limiter circuit having an input terminal, a ground terminal, a positive power supply, a negative power supply, an output terminal, a first resistor coupled to the input terminal, a first inductor coupled between the first resistor and ground, the parallel combination of first and second diodes of oppoiste conductivity coupled in parallel with the first inductor between the first resistor and ground, a first transistor having emitter, base, and collector, the base of the first transistor being coupled to the junction between the first resistor and the parallel first inductor and diodes, the emitter of the first transistor being coupled through a second resistor to the negative power supply, the collector of the first transistor being coupled through the series combination of a third resistor and a second inductor to the positive power supply, a second transistor having emitter, base, and collector, the base of the second transistor being coupled through a first capacitor to the collector of the first transistor and being coupled through the parallel combination of a third inductor, a third diode, and a fourth diode of conductivity opposite to that of the third diode to ground, the emitter of the second transistor being coupled through a fourth resistor to the negative power supply, and the collector of the second transistor being coupled through the series combination of a fifth resistor and a fourth inductor to the positive power supply, a third transistor having emitter, base, and collector, the base of the third transistor being coupled through a second capacitor to the collector of the second transistor through the parallel combination of a fifth inductor, a fifth diode and a sixth diode of conductivity opposite that of the fifth diode to ground, and through a first feedback resistor to the emitter of the first transistor, the emitter of the third transistor being coupled through a sixth resistor to the negative power supply and the collector of the third transistor being coupled through the series combination of a seventh resistor and a sixth inductor to the positive power supply, a fourth transistor having emitter, base, and collector, the base of the fourth transistor being coupled through a third capacitor to the collector of the third transistor, through the parallel combination of a seventh inductor, a seventh diode, and an eighth diode of conductivity opposite that of the seventh diode to ground, and through a second feedback resistor to the emitter of the second transistor, the emitter of the fourth transistor being coupled through an eighth resistor to the negative power supply and the collector of the fourth transistor being coupled to the series combination of a ninth resistor and an eighth inductor to the positive power supply, a fifth transistor having emitter, base, and collector, the base of the fifth transistor being copled through a fourth capacitor to the collector of the fourth transistor, through the parallel combination of a ninth inductor, a ninth diode, and a tenth diode of conductivity opposite to that of the ninth diode to ground, and through a third feedback resistor to the emitter of the third transistor, the emitter of the fifth transistor being coupled through a tenth resistor to the negative power supply and the collector of the fifth transistor being coupled through the series combination of an eleventh resistor and a tenth inductor to the positive power supply, a sixth transistor having emitter, base, and collector, the base of the sixth transistor being coupled through a fifth capacitor to the collector of the fifth transistor, through the parallel combination of an eleventh inductor, an eleventh diode, and a twelfth diode of conductivity opposite to that of the eleventh diode to ground, and through a fourth feedback resistor to the emitter of the fourth transistor, the emitter of the sixth transistor being coupled through a twelfth resistor to the negative power supply and being directly coupled to the output terminal, the collector of the sixth transistor being coupled through a thirteenth resistor to the positive power supply.

8. A limiter circuit according to claim 2, further defined by an inductor coupled between the output electrode of each active element and ground.

9. A limiter circuit comprising respective pluralities of odd and even amplifier stages each having input and output electrodes, said odd and even stages coupled in alternate succession, separate limiting means coupled to the output electrode of each of said stages, a plurality of degenerative feedback loops respectively coupled from the output electrodes of the odd amplifier stages to the input electrodes of the immediately preceding even amplifier stages, and a second plurality of degenerative feedback loops respectively coupled from the output electrodes of the even amplifier stages to the input electrodes of the immediately preceding odd amplifier stages.

References Cited by the Examiner

UNITED STATES PATENTS

| | | | |
|---|---|---|---|
| 2,810,072 | 10/1957 | Amatniek. | |
| 3,120,616 | 2/1964 | Ishimoto et al. | 307—88.5 |
| 3,254,230 | 5/1966 | Wahrer | 307—88.5 |
| 3,264,569 | 8/1966 | Lefferts | 330—28 X |

OTHER REFERENCES

Applications Engineering Digest, No. 67, "Video Amplifiers Using the 2N741 Mesa Transistor," Semiconductor Products, April 1961, page 51.

ROY LAKE, *Primary Examiner.*

J. B. MULLINS, *Assistant Examiner.*